United States Patent
Peters

(10) Patent No.: US 7,205,581 B2
(45) Date of Patent: Apr. 17, 2007

(54) THYRISTOR STRUCTURE AND OVERVOLTAGE PROTECTION CONFIGURATION HAVING THE THYRISTOR STRUCTURE

(75) Inventor: Christian Peters, Vaterstetten (DE)

(73) Assignee: Infineon Technologies AG, München (DE)

( * ) Notice: Subject to any disclaimer, the term of this patent is extended or adjusted under 35 U.S.C. 154(b) by 0 days.

(21) Appl. No.: 10/657,899

(22) Filed: Sep. 9, 2003

(65) Prior Publication Data

US 2004/0046181 A1 Mar. 11, 2004

Related U.S. Application Data

(63) Continuation of application No. PCT/DE02/00547, filed on Feb. 15, 2002.

(30) Foreign Application Priority Data

Mar. 9, 2001 (DE) ................. 101 11 462

(51) Int. Cl.
*H01L 29/74* (2006.01)
(52) U.S. Cl. .............. 257/107; 257/355; 257/173; 257/E29.225
(58) Field of Classification Search .......... 257/107, 257/123, 111–112, 139, 157, 173–175, 134–136, 257/388, 125, 355–360, 361–363, 546, 328, 257/350–354; 363/27, 96, 54, 135, 85, 129
See application file for complete search history.

(56) References Cited

U.S. PATENT DOCUMENTS 3,586,928 A * 6/1971 Bergman et al. ............ 257/157
4,695,916 A * 9/1987 Satoh et al. ................... 361/56
4,779,126 A    10/1988 Herman
4,896,243 A    1/1990 Chatterjee et al.
4,980,741 A * 12/1990 Temple ........................ 257/154
5,072,273 A * 12/1991 Avery .......................... 257/173
5,077,591 A * 12/1991 Chen et al. .............. 357/23.13
5,126,816 A * 6/1992 Reczek et al. .............. 257/372
5,182,220 A * 1/1993 Ker et al. .................... 438/200
5,235,201 A * 8/1993 Honna ......................... 257/173
5,272,363 A * 12/1993 Pezzani ...................... 257/173
5,400,202 A * 3/1995 Metz et al. ................... 361/56
5,453,384 A    9/1995 Chatterjee
5,465,189 A    11/1995 Polgreen et al.
5,517,379 A * 5/1996 Williams et al. .............. 361/84

(Continued)

FOREIGN PATENT DOCUMENTS

EP     1 045 444 A2    10/2000

(Continued)

*Primary Examiner*—Thao X. Le
(74) *Attorney, Agent, or Firm*—Laurence A. Greenberg; Werner H. Stemer; Ralph E. Locher

(57) ABSTRACT

A thyristor structure having a first terminal, formed as a first region with a first conductivity type, is provided. A second region of a second conductivity type adjoins the first region. A third region of the first conductivity type, which adjoins the second region, has a common surface with the latter. A second terminal, as fourth region of the second conductivity type, adjoins the third region. At the common surface of the second region and the third region, an auxiliary electrode is disposed in a manner adjoining at least one of the two regions.

6 Claims, 1 Drawing Sheet

U.S. PATENT DOCUMENTS

| | | | | |
|---|---|---|---|---|
| 5,576,557 A * | 11/1996 | Ker et al. | ................... | 257/173 |
| 5,637,900 A * | 6/1997 | Ker et al. | ................... | 257/355 |
| 5,682,047 A * | 10/1997 | Consiglio et al. | ........... | 257/335 |
| 5,739,998 A * | 4/1998 | Wada | ........................ | 361/56 |
| 5,754,380 A * | 5/1998 | Ker et al. | ................... | 361/56 |
| 5,907,462 A | 5/1999 | Chatterjee et al. | | |
| 5,945,723 A * | 8/1999 | Mori | ........................ | 257/487 |
| 5,977,594 A * | 11/1999 | Takao | ....................... | 257/357 |
| 6,081,002 A * | 6/2000 | Amerasekera et al. | ...... | 257/173 |
| 6,215,135 B1 * | 4/2001 | Schroder | ................... | 257/173 |
| 6,323,523 B1 * | 11/2001 | Lee et al. | ................... | 257/355 |
| 6,353,247 B1 * | 3/2002 | Pan | ............................ | 257/173 |
| 6,423,987 B1 * | 7/2002 | Constapel et al. | .......... | 257/173 |
| 6,424,013 B1 * | 7/2002 | Steinhoff et al. | ........... | 257/355 |
| 6,469,325 B1 * | 10/2002 | Ishizuka et al. | ............ | 257/173 |
| 6,479,869 B1 * | 11/2002 | Hiraga | ....................... | 257/350 |
| 6,542,346 B1 * | 4/2003 | Chen et al. | ................. | 361/111 |
| 6,548,865 B2 * | 4/2003 | Fujihira et al. | ............. | 257/341 |
| 6,713,841 B2 * | 3/2004 | Gossner | ...................... | 257/546 |
| 2003/0075726 A1 * | 4/2003 | Ker et al. | ................... | 257/107 |

FOREIGN PATENT DOCUMENTS

| | | |
|---|---|---|
| EP | 1 058 308 A1 | 12/2000 |
| JP | 61-12072 | 1/1986 |
| WO | 00/086888 | 2/2000 |

* cited by examiner

THYRISTOR STRUCTURE AND OVERVOLTAGE PROTECTION CONFIGURATION HAVING THE THYRISTOR STRUCTURE

CROSS-REFERENCE TO RELATED APPLICATION

This application is a continuation of copending International Application No. PCT/DE02/00547, filed Feb. 15, 2002, which designated the United States and was not published in English.

BACKGROUND OF THE INVENTION

Field of the Invention

The invention relates to a thyristor structure and an overvoltage protection configuration. The thyristor structure contains a first terminal formed as a first region and of a first conductivity type, a second region formed of a second conductivity type and adjoining the first region, a third region formed of the first conductivity type and adjoining the second region and having a common surface with the second region, and a second terminal functioning as a fourth region, formed of the second conductivity type, and adjoining the third region.

Nowadays, thyristor structures having a planar structure are customary when using CMOS technologies. At the surface of such a component, an n⁻-type region and a p⁻-type region are disposed such that they lie next to one another, which regions also form the so-called base regions of the thyristor structure. A p⁺-type region, which represents an anode terminal, is formed in the n⁻-type region. An n⁺-type region formed in the p⁺-type region represents a cathode terminal. A p⁺-type region formed in the p⁻-type region in turn forms a control terminal.

In the production of the structure described above, a nitride layer is applied to a surface. Charges in the nitride layer lead to a parasitic field effect. The same parasitic effect occurs if, at the surface, contaminants are incorporated in the regions during production.

The thyristor structure described above is employed particularly frequently in overvoltage protection configurations for a so-called ESD protection. The latter is frequently employed in MOS input stages of integrated circuits. An overvoltage detector is disposed at that part of the integrated circuit that is to be protected. The overvoltage detector is connected to the control terminal of the thyristor. A configuration of this type is described in U.S. Pat. No. 4,896,243.

The anode and cathode of the thyristor are in turn connected to the supply voltage of the component to be protected, if the supply voltage is to be monitored.

If an overvoltage then occurs, the thyristor is switched on via the control terminal and the overvoltage is conducted away.

If the parasitic field-effect transistor, as described above, is then formed, the monitored voltage is short-circuited, which leads to the total failure of the component to be protected.

U.S. Pat. Nos. 5,907,462 and 5,465,189 disclose ESD structures that are controlled by a field-effect structure.

SUMMARY OF THE INVENTION

It is accordingly an object of the invention to provide a thyristor structure and an overvoltage protection configuration having the thyristor structure which overcome the above-mentioned disadvantages of the prior art devices and methods of this general type, which avoids the influence of parasitic effects.

With the foregoing and other objects in view there is provided, in accordance with the invention, a thyristor structure. The thyristor structure contains a first terminal formed as a first region having a first conductivity type, a second region of a second conductivity type adjoining the first region, a third region of the first conductivity type adjoining the second region and having a common surface with the second region, and a second terminal functioning as a fourth region, formed of the second conductivity type, and adjoining the third region. Auxiliary electrodes are disposed on the common surface and each adjoins the second region or the third region. A control terminal for controlling the thyristor structure by an applied current is embodied the second region or the third region.

By forming at least one auxiliary electrode at the surface of one of the two regions of the second and third regions, it is possible to put the surface in the region of the auxiliary electrode into a predetermined charge state.

An overvoltage protection configuration having such a thyristor structure does not lead to the failure of the components to be protected as a result of parasitic effects.

By providing an auxiliary electrode in each case on the second and third regions and connecting the auxiliary electrodes on the second region to the first terminal and the auxiliary electrode at the third region to the second terminal, the predetermined charge states can be produced at the surface in a simple manner.

By forming the auxiliary electrode with polysilicon and a gate oxide that isolates the latter from the second and third regions, the auxiliary electrode can be produced in a simple manner using a customary technology.

By integrating the overvoltage protection configuration on a semiconductor chip. The overvoltage protection can be produced simply and effectively. An overvoltage detector is used for detecting an overvoltage across a component to be protected.

Other features which are considered as characteristic for the invention are set forth in the appended claims.

Although the invention is illustrated and described herein as embodied in a thyristor structure and an overvoltage protection configuration having the thyristor structure, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 3:
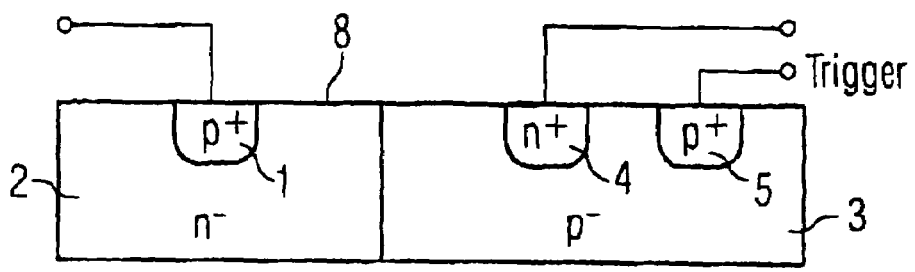
FIG. 3 is a sectional view of a customary thyristor structure according to the prior art.

Referring now to the figures of the drawing in detail and first, particularly, to FIG. 3 thereof, there is shown a thyristor structure known in the prior art. At a surface of such a component, an n⁻-type region 2 and a p⁻-type region 3 are disposed such that they lie next to one another, which regions also form the so-called base regions of the thyristor structure. A p⁺-type region 1, which represents an anode terminal, is formed in the n⁻-type region 2. An n⁺-type region 4 formed in the p⁺-type region 3 represents a cathode terminal. A p⁺-type region 5 formed in the p⁻-type region 3 in turn forms a control terminal.

In the production of the structure described above, a nitride layer is applied to a surface 8. Charges in the nitride layer lead to a parasitic field effect. The same parasitic effect occurs if, at the surface 8, contaminants are incorporated in the regions 2 and 3 during production.

Figure 1:
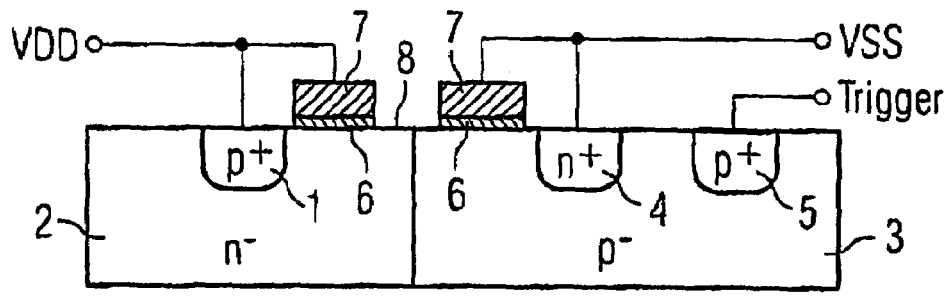
FIG. 1 is a diagrammatic, sectional view of a thyristor structure according to the invention.

An exemplary embodiment according to the invention of a thyristor structure that, in principle, corresponds to that which has already been explained in the introduction to the description with reference to FIG. 3, is shown in FIG. 1. In this case, identical parts are provided with identical reference symbols.

In the exemplary embodiment illustrated, mutually isolated auxiliary electrodes are additionally formed at the common surface of the second region 2 and third region 3, which are often also referred to as base regions of the thyristor. The auxiliary electrodes are composed of a gate oxide 6, customary for the production of field-effect transistors, and an electrode contact 7 made of polysilicon. The electrode contact 7 of the auxiliary electrode that is formed at the surface of the surface region 2 is electrically conductively connected to the first terminal 1, the anode contact. The auxiliary electrode that is formed at the third region 3 is electrically conductively connected to the second terminal, the cathode contact. This ensures that a conductive channel that would bring about a short circuit between the first terminal 1 and the second terminal 3 cannot form at the surface in the base regions as a result of parasitic effects. The thyristor structure is turned on only by a current being impressed at the control terminal 5.

Figure 2:
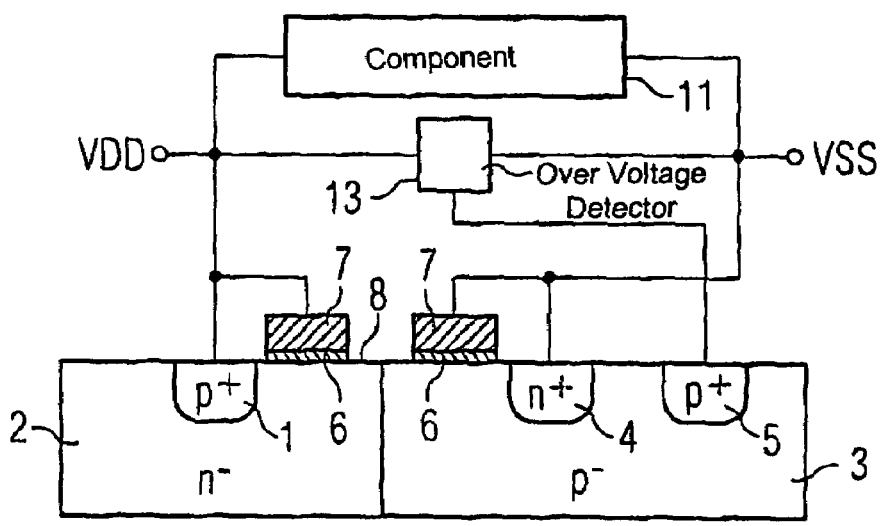
FIG. 2 is an illustration of an overvoltage protection configuration according to the invention.

FIG. 2 shows a basic illustration of the thyristor structure in an overvoltage configuration. The thyristor structure described above is connected by its anode and cathode terminals i.e. by the first terminal 1 and the second terminal 3, to a supply voltage VDD and VSS of the component 11 to be protected. An overvoltage detector device 13 monitors the supply voltage of a component 11 to be protected. When an overvoltage occurs, the overvoltage detector device 13 impresses a current via the control terminal 5 into a base region, namely the third region 3, of the thyristor structure. The latter triggers and short-circuits the supply voltage.

The configuration is particularly suitable for integration. Therefore, the thyristor structure is integrated with the overvoltage detector 13 at the surface of the component to be detected, the two auxiliary electrodes avoiding the situation where the thyristor structure is disposed below a thick oxide in order to avoid parasitic effects. Consequently, the action of the thyristor structure is completely maintained.

Furthermore, such a configuration can be applied to other instances of voltage monitoring, such as the voltage of signal inputs.

I claim:

1. A thyristor structure, comprising:
   a first terminal formed as a first region having a first conductivity type;
   a second region of a second conductivity type adjoining said first region;
   a third region of the first conductivity type adjoining said second region and having a common surface with said second region;
   a second terminal functioning as a fourth region, formed of the second conductivity type, and adjoining said third region;
   said first terminal and said second terminal each being connected to a respective one of a first potential and a second potential;
   auxiliary electrodes disposed on said common surface and each adjoining one of said second and third regions so that no further structure is formed between the auxiliary electrodes and a boundary of the second and third regions, said auxiliary electrodes being formed as gate electrodes, said auxiliary electrodes being electrically conductively connected with a respective one of said first terminal and said second terminal, and said auxiliary electrodes being so formed on said common surface that no parasitic effect between said first terminal and said second terminal leads to a conductive state between said two terminals; and
   a control terminal adapted to control the thyristor structure by an applied current embodied in one of said second region and said third region, said control terminal being formed of the same conductivity type as a surrounding region thereof.

2. The thyristor structure according to claim 1, wherein said auxiliary electrodes are each formed from a conductive region made of polysilicon and an auxiliary oxide insulating said conductive region from said common surface.

3. An overvoltage protection configuration, comprising:
   a thyristor structure containing:
   a first terminal formed as a first region having a first conductivity type;
   a second region of a second conductivity type adjoining said first region;
   a third region of the first conductivity type adjoining said second region and having a common surface with said second region;
   a second terminal functioning as a fourth region, formed of the second conductivity type, a component to be protected disposed in an electrically conductive manner between said first terminal and said second terminal;
   said first terminal and said second terminal each being connected to a respective one of a first potential and a second potential;
   auxiliary electrodes disposed on said common surface and each adjoining one of said second and third regions so that no further structure is formed between the auxiliary electrodes and a boundary of the second and third regions, said auxiliary electrodes being formed as gate electrodes, said auxiliary electrodes being electrically conductively connected with a respective one of said first terminal and said second terminal, and said auxiliary electrodes being so formed on said common surface that no parasitic effect between said first terminal and said second terminal leads to a conductive state between said two terminals; and a control terminal adapted to control the thyristor structure by an applied current embodied in one of said second region and said third region, said control terminal being formed of the same conductivity type as a surrounding region thereof; and an overvoltage detector connected to and detecting an overvoltage across the component to be protected.

4. The overvoltage protection configuration according to claim 3, wherein said control terminal forms a fifth region and is formed of the first conductivity type, said fifth region having a higher conductivity than said third region.

5. The overvoltage protection configuration according to claim 3, wherein a supply voltage of the component to be protected is connected to said first terminal and to said second terminal.

6. An overvoltage protection configuration, comprising:
a single semiconductor chip;
a thyristor structure integrated in said single semiconductor chip and containing:
    a first terminal formed as a first region having a first conductivity type;
    a second region of a second conductivity type adjoining said first region;
    a third region of the first conductivity type adjoining said second region and having a common surface with said second region;
    a second terminal functioning as a fourth region, formed of the second conductivity type, a component to be protected disposed in an electrically conductive manner between said first terminal and said second terminal;
    said first terminal and said second terminal each being connected to a respective one of a first potential and a second potential;
    auxiliary electrodes disposed on said common surface and each adjoining one of said second and third regions so that no further structure is formed between the auxiliary electrodes and a boundary of the second and third regions, said auxiliary electrodes being formed as gate electrodes, said auxiliary electrodes being electrically conductively connected with a respective one of said first terminal and said second terminal, and said auxiliary electrodes being so formed on said common surface that no parasitic effect between said first terminal and said second terminal leads to a conductive state between said two terminals;
a control terminal adapted to control the thyristor structure by an applied current embodied in one of said second region and said third region, said control terminal being formed of the same conductivity type as a surrounding region thereof; and
an overvoltage detector connected to and detecting an overvoltage across the component to be protected.

* * * * *